US007016416B1

(12) United States Patent
Lynch et al.

(10) Patent No.: US 7,016,416 B1
(45) Date of Patent: Mar. 21, 2006

(54) LOW COST VIDEO COMPRESSION USING FAST, MODIFIED Z-CODING OF WAVELET PYRAMIDS

(75) Inventors: William C. Lynch, Palo Alto, CA (US); Krasimir D. Kolarov, Menlo Park, CA (US); William J. Arrighi, El Cerrito, CA (US)

(73) Assignee: Vulcan Patents LLC, Seattle, WA (US)

( * ) Notice: Subject to any disclaimer, the term of this patent is extended or adjusted under 35 U.S.C. 154(b) by 272 days.

(21) Appl. No.: 10/397,663

(22) Filed: Mar. 25, 2003

Related U.S. Application Data

(63) Continuation of application No. 09/444,226, filed on Nov. 19, 1999, now Pat. No. 6,570,924.

(60) Provisional application No. 60/109,323, filed on Nov. 20, 1998.

(51) Int. Cl.
H04N 7/12 (2006.01)
H04N 11/02 (2006.01)

(52) U.S. Cl. .......................... 375/240.18; 375/240.25; 341/50

(58) Field of Classification Search ........... 375/240.18, 375/240.25; 341/107, 51, 50, 106; 382/232, 382/233, 247
See application file for complete search history.

(56) References Cited

U.S. PATENT DOCUMENTS

| 5,059,976 | A | 10/1991 | Ono et al. |
| 5,109,226 | A | 4/1992 | MacLean, Jr. et al. |
| 5,307,062 | A | 4/1994 | Ono et al. |
| 5,412,741 | A | 5/1995 | Shapiro |
| 5,463,699 | A | 10/1995 | Wilkinson |
| 5,471,206 | A | 11/1995 | Allen et al. |

(Continued)

OTHER PUBLICATIONS

Bottou et al, "The Z-Coder Adaptive Binary Coder", AT&T Labs-Research Red Bank, NJ 07701-7033, Proceedings of the Data Compression Conference, pp. 13-22, Snowbird, Utah, Mar. 1998.

(Continued)

*Primary Examiner*—Gims Philippe
*Assistant Examiner*—Erick Rekstad
(74) *Attorney, Agent, or Firm*—Van Pelt, Yi & James LLP

(57) ABSTRACT

Encoding/decoding a stream of bits is disclosed. An encoding unit uses a modified Z-coder to code the zero/non-zero significance function and Huffman coding for the non-zero coefficients themselves. The encoding unit includes a significance function generator that receives coefficients and outputs a single significance bit. A zero coefficient eliminator receives coefficients in parallel with the significance function generator and outputs coefficients if non-zero. Output from the significance function generator is coded using the modified Z-coder. Output from the zero coefficient eliminator is coded using Huffman coding. Both outputs are combined to form the resulting compressed stream. The modified Z-coder is similar to a standard Z-coder but uses a different technique for the LPS (least probable symbol) case during encoding and decoding that results in a Z-coder that functions appropriately.

6 Claims, 7 Drawing Sheets

U.S. PATENT DOCUMENTS

| | | |
|---|---|---|
| 5,764,807 A | 6/1998 | Pearlman et al. |
| 5,790,706 A | 8/1998 | Auyeung |
| 5,859,604 A | 1/1999 | Slattery et al. |
| 5,900,953 A | 5/1999 | Bottou et al. |
| 5,949,912 A | 9/1999 | Wu |
| 5,982,434 A | 11/1999 | Tong et al. |
| 6,058,214 A | 5/2000 | Bottou et al. |
| 6,101,265 A * | 8/2000 | Bacus et al. ............... 382/133 |
| 6,222,468 B1 * | 4/2001 | Allen ........................ 341/107 |
| 6,225,925 B1 * | 5/2001 | Bengio et al. .............. 341/107 |
| 6,281,817 B1 * | 8/2001 | Bengio et al. .............. 341/107 |
| 6,359,928 B1 | 3/2002 | Wang |

OTHER PUBLICATIONS

Ono, et al, "Bi-Level Image Coding with Melcode—Comparison of Block Type Code and Arithmetic Type Code," Proc IEEE Global Telecommunications Conference, Nov. 1989, p. 257.

* cited by examiner

P(LPS) VERSUS DELTA

LOW COST VIDEO COMPRESSION USING FAST, MODIFIED Z-CODING OF WAVELET PYRAMIDS

This application claims priority of U.S. provisional patent application No. 60/109,323 filed Nov. 20, 1998 entitled "Fast, Modified Z-Coding of Wavelet Pyramids," which is hereby incorporated by reference. This application is a continuation of application Ser. No. 09/444,226 filed Nov. 19, 1999 now U.S. Pat. No. 6,570,924 entitled: LOW COST VIDEO COMPRESSION USING FAST, MODIFIED Z-CODING OF WAVELET PYRAMIDS, which is hereby incorporated by reference.

FIELD OF THE INVENTION

The present invention relates generally to compression and decompression of data. More specifically, the present invention relates to a fast, low-complexity video coder/decoder.

BACKGROUND OF THE INVENTION

A number of important applications in image processing require a very low cost, fast and good quality video codec (coder/decoder) implementation that achieves a good compression ratio. In particular, a low cost and fast implementation is desirable for low bit rate video applications such as video cassette recorders (VCRs), cable television, cameras, set-top boxes and other consumer devices. In particular, it is often desirable for such a codec to be implemented on a low-cost, relatively small, single integrated circuit.

In general, an image transform codec consists of three steps: 1) a reversible transform, often linear, of the pixels for the purpose of decorrelation, 2) quantization of the transform values, and 3) entropy coding of the quantized transform coefficients. In general, a fast, low cost codec is desirable that would operate on any string of symbols (bits, for example) and not necessarily those produced as part of an image transform. For purposes of illustration, though, and for ease of understanding by the reader, a background is discussed in the context of compression of video images, although the applicability of the invention is not so limited.

A brief background on video images will now be described. FIG. 1 illustrates a prior art image representation scheme that uses pixels, scan lines, stripes and blocks. Frame 12 represents a still image produced from any of a variety of sources such as a video camera, a television, a computer monitor etc. In an imaging system where progressive scan is used each image 12 is a frame. In systems where interlaced scan is used, each image 12 represents a field of information. Image 12 may also represent other breakdowns of a still image depending upon the type of scanning being used. Information in frame 12 is represented by any number of pixels 14. Each pixel in turn represents digitized information and is often represented by 8 bits, although each pixel may be represented by any number of bits.

Each scan line 16 includes any number of pixels 14, thereby representing a horizontal line of information within frame 12. Typically, groups of 8 horizontal scan lines are organized into a stripe 18. A block of information 20 is one stripe high by a certain number of pixels wide. For example, depending upon the standard being used, a block may be 8×8 pixels, 8×32 pixels, or any other size. In this fashion, an image is broken down into blocks and these blocks are then transmitted, compressed, processed or otherwise manipulated depending upon the application. In NTSC video (a television standard using interlaced scan), for example, a field of information appears every 60th of a second, a frame (including 2 fields) appears every 30th of a second and the continuous presentation of frames of information produce a picture. On a computer monitor using progressive scan, a frame of information is refreshed on the screen every 30th of a second to produce the display seen by a user.

As mentioned earlier, compression of such video images (for example) involves transformation, quantization and encoding. Many prior art encoding techniques are well-known, including arithmetic coding. Arithmetic coding is extremely effective and achieves nearly the highest compression but at a cost. Arithmetic coding is computational intensive and requires multipliers when implemented in hardware (more gates needed) and runs longer when implemented in software. As such, coders that only perform shifts and adds without multiplication are often desirable for implementation in hardware.

One such coder is the Z-coder, described in *The Z-Coder Adaptive Coder*, L. Bottou, P. G. Howard, and Y. Bengio, *Proceedings of the Data Compression Conference*, pp. 13–22, Snowbird, Utah, March 1998. The Z-coder described achieves high compression without the use of multipliers. Although the Z-coder described in the above paper has the promise to be an effective codec, it may not perform as well as described.

Therefore, a compression technique for data in general and for video in particular is desirable which may be implemented in hardware of modest size and very low cost. It would be further desirable for such a compression technique to take advantage of the benefits provided by the Z-coder.

SUMMARY OF THE INVENTION

To achieve the foregoing, and in accordance with the purpose of the present invention, a modified Z-coder is disclosed that achieves low cost, fast compression and decompression of data.

A fast, low-complexity, entropy efficient video coder for wavelet pyramids is described, although the invention is not limited to video compression nor to a transform using wavelets. This coder approaches the entropy-limited coding rate of video wavelet pyramids, is fast in both hardware and software implementations, and has low complexity (no multiplies) for use in ASICs. It uses a modified Z-coder to code the zero/non-zero significance function and Huffman coding for the non-zero coefficients themselves. Adaptation is not required. There is a strong speed-memory trade-off for the Huffman tables allowing the coder to be customized to a variety of platform parameters.

The present invention is implementable in a small amount of silicon area, at a modest cost in coding efficiency. With only 15% of the coefficients requiring coding of the coefficient value, speed and efficiency in identifying that minority of values via the significance function is an important step. The average run of correct prediction of significance values is about 20, so efficient run coding is important. While the importance of the 3 bits of context and the asymmetry strongly indicates the use of an arithmetic coder, an arithmetic coder can be too costly.

The requirement for a fast algorithm implementable in minimal silicon area demands that something other than a traditional arithmetic coder be used. In particular, multiplies are to be avoided as they are very expensive in silicon area.

The modified Z-coder presented herein provides a codec that avoids multiplies, provides very good compression and functions appropriately to encode and decode bit streams.

Another advantage of the modified Z-coder is its simplicity and speed in view of hardware implementation. In one embodiment in software non-optimized for speed, the modified Z-coder is several orders of magnitude faster than the commercial (well optimized) MPEG2 software encoder used for the same quality. An optimized modified Z-coder should achieve 20–30 times improvement in performance with respect to MPEG2.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

Figure 1:
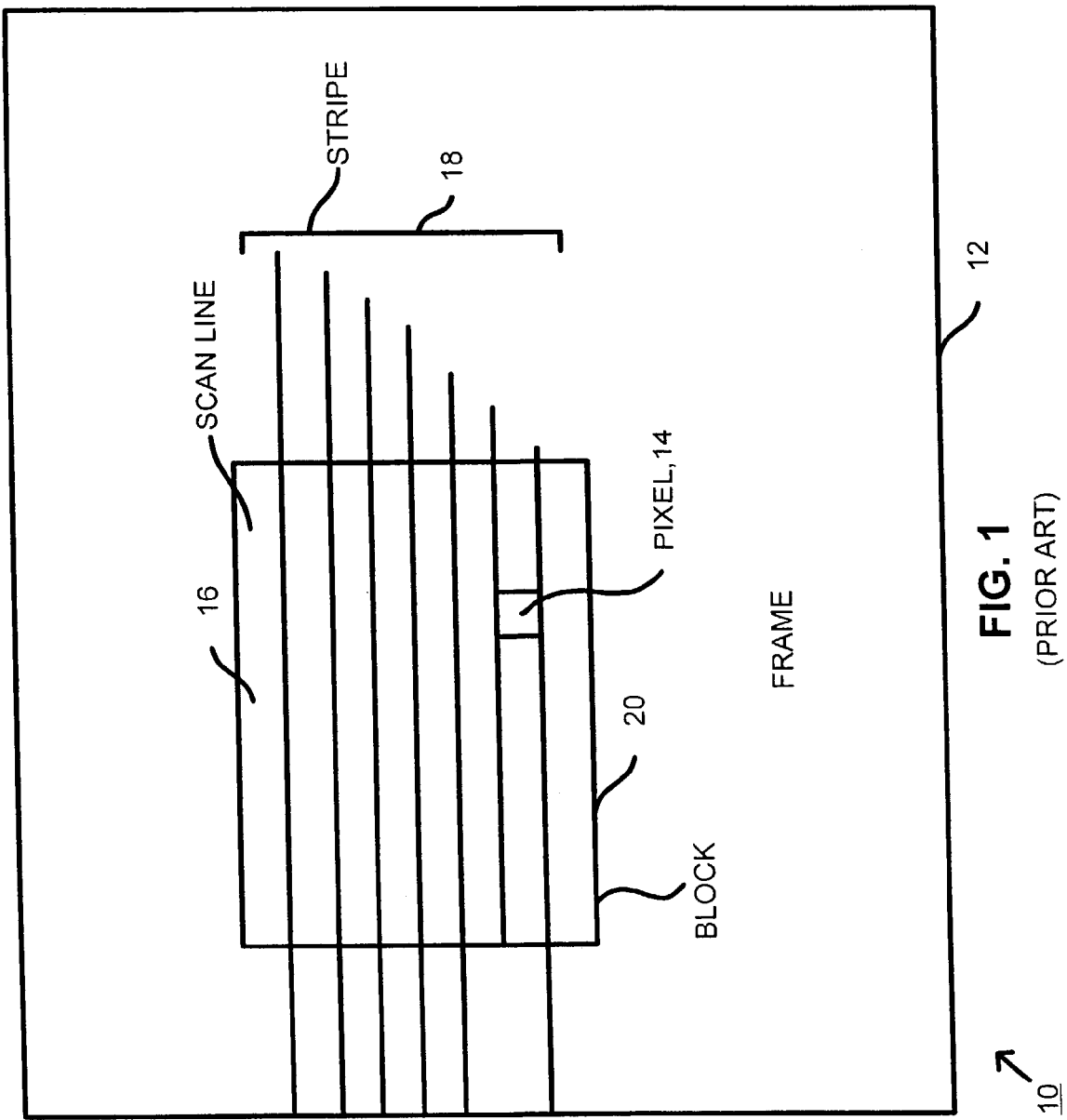
FIG. 1 illustrates a prior art image representation scheme.
Figure 2:
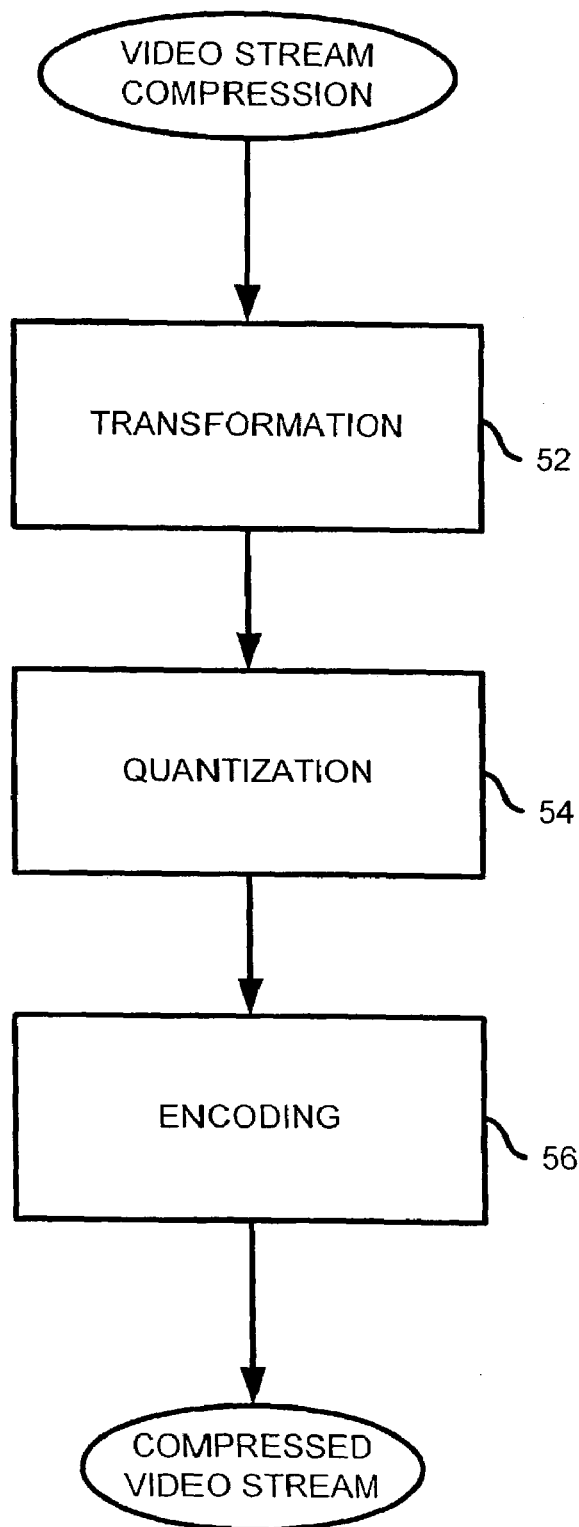
FIG. 2 illustrates a prior art technique for compression of a video stream.

As previously mentioned, and as shown in FIG. 2, an image transform codec typically includes three steps: 1) a reversible transform, often linear, of the pixels for the purpose of decorrelation, 2) quantization of the transform values, and 3) entropy coding of the quantized transform coefficients. The present invention describes an entropy codec which is fast, efficient in silicon area, coding-wise efficient, and practical when the transform is a wavelet pyramid. Although the present invention is presented herein in the context of image compression using a wavelet transform, the present invention is applicable for encoding of any suitable bit stream, and not necessarily a bit stream from an image nor for use necessarily with a wavelet transform.

FIG. 2 illustrates a prior art technique for compression of a video stream. Step 52 receives the pixels from a video image and performs a transform. Any linear or non-linear transform may be used including wavelet, DCT, fractal, etc. The coefficients produced from the transform are then input to step 54 where quantization is performed, an optional step. Quantization is well-known in the art and any suitable quantizer may be used. Next, the quantized coefficients are input to an encoder in step 56 where the coefficients are encoded for further compression. Any suitable known encoding algorithm may be used. The output from the encoder is the compressed video stream. Decompression of the compressed video stream is a reverse of compression.

Wavelet Pyramid Embodiment

One embodiment of the invention for use on video uses quantized wavelet pyramids derived from NTSC video quantized to be viewed under standard conditions. These video pyramids have substantial runs of zeros and also substantial runs of non-zeros. In this embodiment, a modification of the Z-codec is developed and applied to code zero vs. non-zero in quantized video pyramids. Z-codecs have the advantage of a simple (no multiplies) and fast implementation combined with coding performance approximating that of an arithmetic codec. The modified Z-coder implementation described herein approximates an adaptive binary arithmetic coder using dyadic broken line approximation. It has a very short "fastpath" and is attractive for application to a wavelet significance function. The non-zero coefficients of the pyramid are coded (coefficient-by-coefficient) reasonably efficiently with standard Huffman coding.

A wavelet transform is known in the art, and a specific use of a wavelet transform on an image to be compressed is described in U.S. patent application Ser. No. 09/079,101 which is incorporated by reference. A variation on a wavelet transform for image compression is described in U.S. patent application Ser. No. 09/087,449 which is also incorporated by reference.

The typical wavelet pyramid acts as a filter bank separating an image into subbands each covering approximately one octave (factor of 2). At each octave typically there are three subbands corresponding to horizontal, vertical, and checkerboard features. Pyramids are typically three to five levels deep, covering the same number of octaves.

If the original image is at all smooth (images typically have a Hölder coefficient of $\frac{2}{3}$ meaning roughly that the image has $\frac{2}{3}$ of a derivative) the magnitude of the wavelet coefficients decreases rapidly. If the wavelet coefficients are arranged in descending order of absolute value, those absolute values will be seen to decrease as $N^{-s}$ where N is the position in the sequence and s is the smoothness of the image. The wavelet pyramid is further sharpened if the wavelet pyramid is scaled to match the characteristics of the human visual system (HVS). Preferably, fewer bits are used in the chroma subbands.

This particular embodiment considers wavelet pyramids drawn from interlaced video consisting of fields of 240×640 pixels. A frame consists of two interlaced fields and is 480×640 pixels. A standard viewing condition is to view such video from six picture heights away so that each pixel subtends 1/(480×6) radians or about (1/48)°. There are therefore 24 pixel pairs (cycles)/° in both the horizontal and vertical directions.

After forming the wavelet pyramid, the wavelet coefficients are scaled (quantized) consistent with the viewing conditions above and the HVS contrast sensitivity function. Each block has the coefficients arranged by subband, with the coarsest subbands first and the finest subband last. Each subband is scanned out video-wise, by row, left to right, from the top row to the bottom row. Thus the magnitude of the coefficients decrease significantly through a block with the significant coefficients clustered at the beginning of the block and the insignificant ones clustered at the end of the block.

The video wavelet pyramid coefficients, by block, are quantized to about 0.5 bits/pixel. About 85% of the wavelet coefficients are zero. The significance value of a coefficient is most likely to be the significance value of the preceding coefficient. Using this rule, 95% of the significance values are correctly predicted. There is an asymmetry in that a significant coefficient preceded by an insignificant coefficient is much more likely than an insignificant coefficient preceded by a significant one. An isolated significant coefficient embedded in a (fine subband) run of insignificant ones is much more likely than an isolated insignificant one in a (coarse subband) of significant ones.

Extending the preceding context to more than just the preceding coefficient does not qualitatively change the prediction but it does affect the probability of the significance of the next coefficient. Preferably, a context of 8 coefficients is useful and allows better prediction due to vertical adjacency. Because the resulting statistics appear stable over a wide range of clips, we have done without the adaptation of the probability tables and have used fixed probabilities.

Compression System Embodiment

Figure 3:
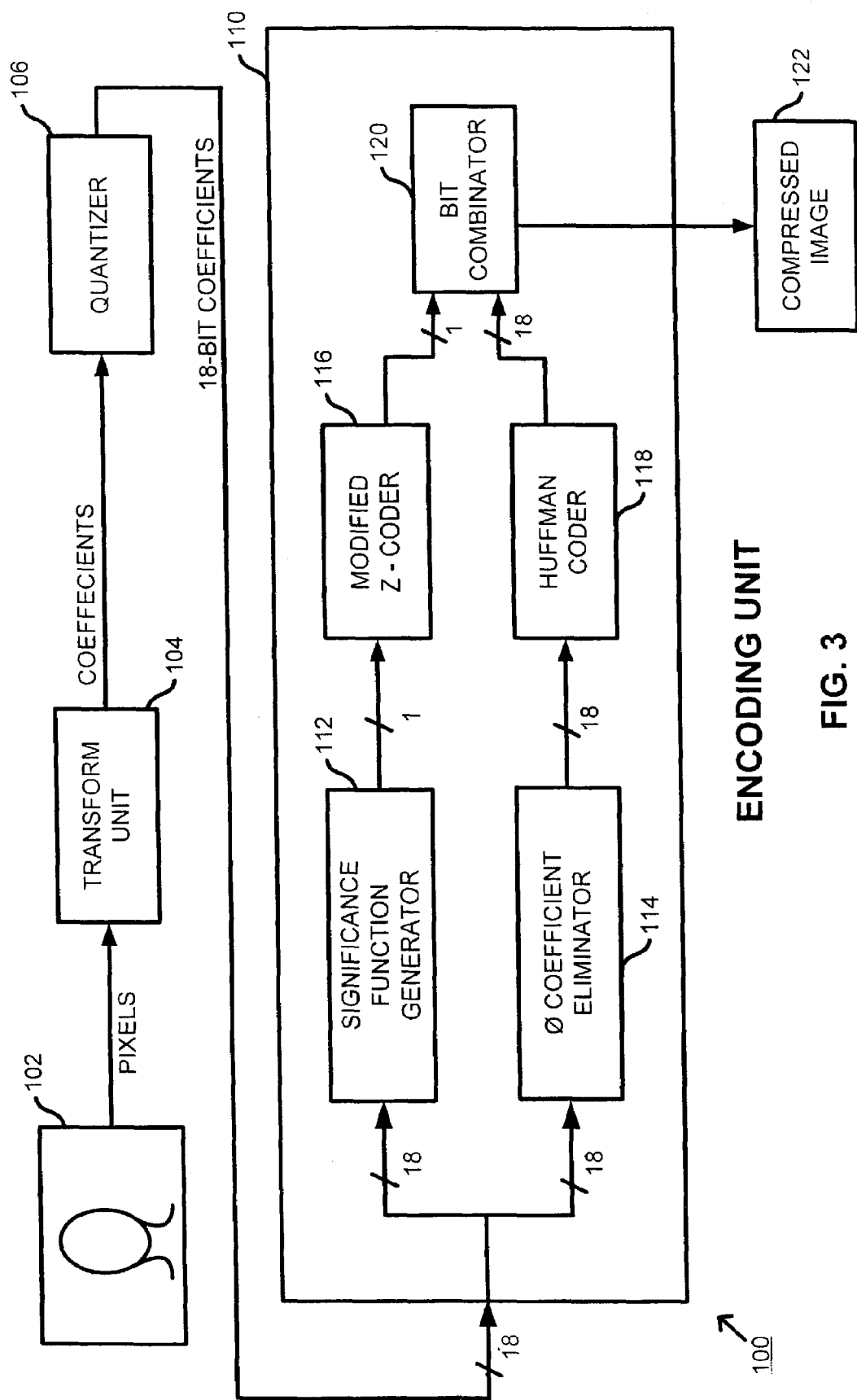
FIG. 3 is a block diagram of a system for compressing video images according to one embodiment of the invention.

FIG. 3 is a block diagram of a system 100 for compressing video images according to one embodiment of the invention. System 100 is for illustrative purposes only; the present invention in general is applicable for encoding/decoding a wide variety of bit streams from many sources. System 100 may be implemented in either hardware software, and its construction will be apparent to those of skill in the art upon a reading of the description below.

System 100 includes a transform unit 104 that receives pixels representing a series of video images. As mentioned earlier, any of a wide variety of transforms may be used; a wavelet transform works well in this embodiment. The coefficients from transform unit 104 are fed into quantizer 106 which quantizes the coefficients using any suitable technique. In this embodiment, coefficients of 18 bits are then fed into encoding unit 110 for the final step of encoding.

Encoding unit 110 receives the 18-bit coefficients and passes them in parallel to a significance function generator 112 and a zero coefficient eliminator 114. Significance function generator 112 generates a "1" if any bit in the coefficient is a "1", and generates a "0" if all bits in the coefficient are "0"s. This function may be performed by a logical "OR" upon all the bits in a coefficient. The zero coefficient eliminator 114 outputs all 18 bits of a coefficient if any bit in the coefficient is a "1", and outputs nothing if all of the bits are "0".

The modified Z-coder 116 accepts the stream of bits from generator 112 and encodes these bits according to an embodiment of the invention. The modified Z-coder 116 can accept any suitable stream of bits, and not necessarily those resulting from video compression. Implementation of the modified Z-coder is described below and flowcharts for encoding and decoding are presented in FIGS. 5 and 6.

Huffman coder 118 receives an 18-bit coefficient from eliminator 114 and encodes the coefficient using the well-known Huffman algorithm. The output from Huffman coder 118 is a variable number of bits per coefficient.

Preferably, Huffman encoding is performed in the following way. The distribution of the values of the non-zero coefficients in this video compression embodiment demonstrates the preponderance of small values. Also, the bits after the first few have little effect on the distribution and can encode themselves (self-encode). The sign (non-zeros only) also has nearly a 50—50 probability and can efficiently self-encode. Encoding can therefore be done efficiently by table look-up.

We begin by taking the absolute value of the coefficient and self-encoding the sign. We then take the last few bits (e.g., bits 0–7) of the coefficient, test to see if the remainder bits (8–N) are only leading zeros, and if so use the last few bits to index into a table E1 ($2^8$ entries). The table will contain the Huffman code and the number of bits in the Huffman code. The Huffman codes can be prepared by lumping all values greater than 255, making coding room for the larger values.

If bits 8–N are not zero but bits 14–N are zero, bits 6–13 are used to index into another table E2. It will also contain the Huffman code and its length. The codes for this table can be prepared by separating the lumps described in the previous paragraph. Appropriate coding room is left for even larger values (after emitting the Huffman code for bits 6–13, the self-coded bits 0–5 are emitted). This process may be iterated as required. The sizes of the tables and the number of levels can be varied in the obvious ways.

In an embodiment where a compressed bit stream is decoded to produce the original stream, Huffman decoding can be performed in the following manner. The first step is to input the sign bit. Then the next 8 bits are used to index into a table D1 (without removing them from the input string). There is a high probability that the next Huffman code will be a head of this index, but this is not guaranteed. A flag in the table indicates which case holds.

In the first, high probability, (terminal entry) case table D1 needs to contain the decoded bits (8 of them in our example) and the number of bits in the Huffman code. The indicated number of bits are removed from the input string. Table D1 also needs a count of the number of self-coded bits that follow and these bits are removed from the input string and composed with the decoded value and the sign to recover the coefficient.

In the second case, the table D1 entry contains the location and $\log_2$ length (k) of a follow-up table $Df_i$. The 8 bits used to index D1 are but a head of the full Huffman code and are removed from the input string. The next k bits are used to index $Df_i$. The process is repeated until a terminal table entry is located. The "k"s may vary from entry to entry. Optimization of these values will trade off table space for execution time.

Bit combinator 120 combines bits output from modified Z-coder 116 and from Huffman coder 118. As will be appreciated by those of skill in the art, combinator 120 recombines significance bits from modified Z-coder 116 with the corresponding Huffman encoded coefficients from Huffman coder 118 and outputs the resulting bits as compressed image 122.

A Modified Z-Coder

Optimally, a fast algorithm is preferable that is implementable in a small amount of silicon area, even at some modest cost in coding efficiency. With only 15% of the coefficients requiring coding of the coefficient value, speed and efficiency in identifying that minority of values via the significance function is an important problem. The average run of correct prediction of significance values is about 20, so efficient run coding is also important. Additionally, the importance of the 3 bits of context and the asymmetry strongly indicates the use of an arithmetic coder.

However, the requirement for a fast algorithm implementable in minimal silicon area demands that something other than a traditional arithmetic coder be used. In particular, multiplies are to be avoided as they are very expensive in silicon area. The chosen algorithm should have a very good "fast path" for the individual elements of the runs. The fact that the significance function has only two values is a specialization not taken advantage of by arithmetic coders in general, but is recognized by a Z-coder.

The Z-coder, described in *The Z-Coder Adaptive Coder*, referenced above, can be viewed as a coder for a binary symbol set which approximates an arithmetic coder. As described, it approximates the coding curve by a dyadic broken line. This enables a binary coder with a short "fastpath" and without requiring multiplies. These properties make it an attractive candidate for coding the wavelet coefficient significance function.

Unfortunately, the Z-coder as described in *The Z-Coder Adaptive Coder* may not perform particularly well. The present invention thus provides below a modified Z-coder that performs extremely well for encoding streams of bits in general, and for use in image compression in particular. Operation of the modified Z-coder 116 of FIG. 3 will now be described generally, and then in detail with reference to the encoding and decoding flowcharts of FIGS. 5 and 6.

Familiarity with *The Z-Coder Adaptive Coder* is assumed in the following description. Recall that the preceding context (ctx) predicts with probability P(ctx)=P(MPS) the next symbol. The bit predicted is referred to as MPS (Most Probable Symbol) whereas the other choice (there are only two symbols in the set) is referred to as LPS (Least Probable Symbol). We always have P(ctx)>=½>=1−P(ctx)=P(LPS). In *The Z-Coder Adaptive Coder*, $\Delta$ is given implicitly, as a function of P(LPS), as $$P(LPS) = \Delta - (\Delta + \tfrac{1}{2})\log_e(\Delta + \tfrac{1}{2}) - (\Delta - \tfrac{1}{2})\log_e(\tfrac{1}{2}) \quad (1.0)$$

Figure 4:
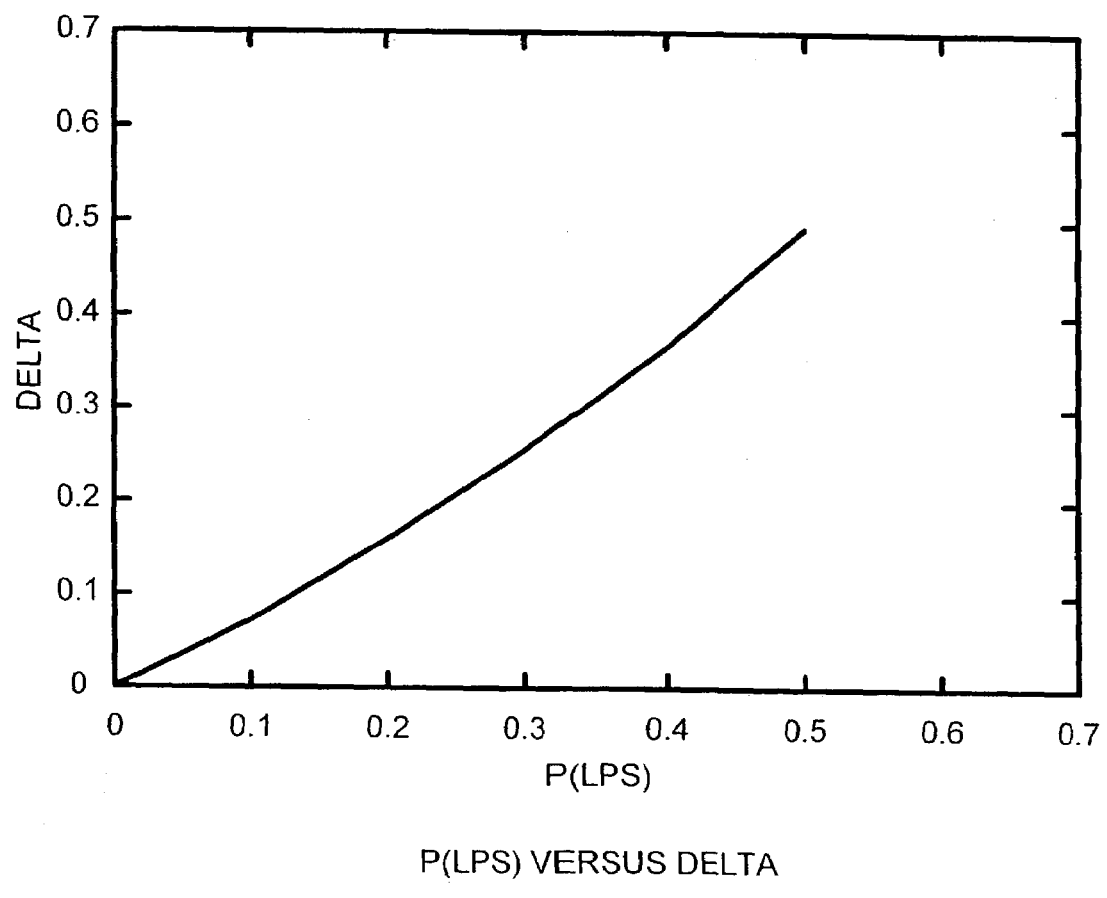
FIG. 4 is a graph of the probability of LPS versus Delta.

The graph of P is shown in FIG. 4. We always have $0 < \Delta \leq \tfrac{1}{2}$ (n. b., sure symbols are eliminated).

As in an arithmetic coder, the code word C is a real binary number with a normalized lower bound A. The split point Z computation is given in equation (1.3).

$$0 \leq A \leq C < 1 \quad (1.1)$$

$$A < \tfrac{1}{2} \quad (1.2)$$

$$A < Z = A + \Delta < 1 \quad (1.3)$$

In other words a split point Z in (A, 1) is determined by the probability prob(MPS|context)=1−prob(LPS|context)

C in [A, Z) codes MPS while C in [Z, 1) codes LPS. If we wish to code an MPS we arrange to output code bits so that Z≤C<; we have A≤C<Z to code an LPS.

On encode we start not knowing any of the bits of C. However, if the lead (i.e., $2^{-1}$) bit of Z and of A are identical then we know that the lead bit of C must agree. So we shift (normalize) the binary point of everything one place to the right and subsequently ignore bits to the left of the binary point as A, C and Z must agree there. The normalizing shift ensures that (1.2) holds at the beginning of the next symbol. The MPS case is relatively easy since the normalizing shifts ensure that $A_{new}=Z_{old} \leq C_{new} < 1$.

A head of C is the code word for a head of the input symbol string. It is dyadically normalized into the interval [0, ½), becoming the lower bound A. A becomes renormalized C and the process is repeated for the next symbol (renormalization being a multiplication by 2).

The LPS case is more delicate. Since the correct C is unknown right of the binary point, we perform binary point shifts (bits shifted out of A go to the code string) until we are assured that the C that appears in the decoder will be not less than the A that appears in the decoder. Z is shifted in lock step with A. When the integer part of Z exceeds the integer part of A we are assured that C<Z at the decoder. Continuing to shift until A=0 assures that A<=Z. Taking fractional parts, C is in [A, 1), A is in [0, ½) and Z is in (A, 1).

Figure 5:
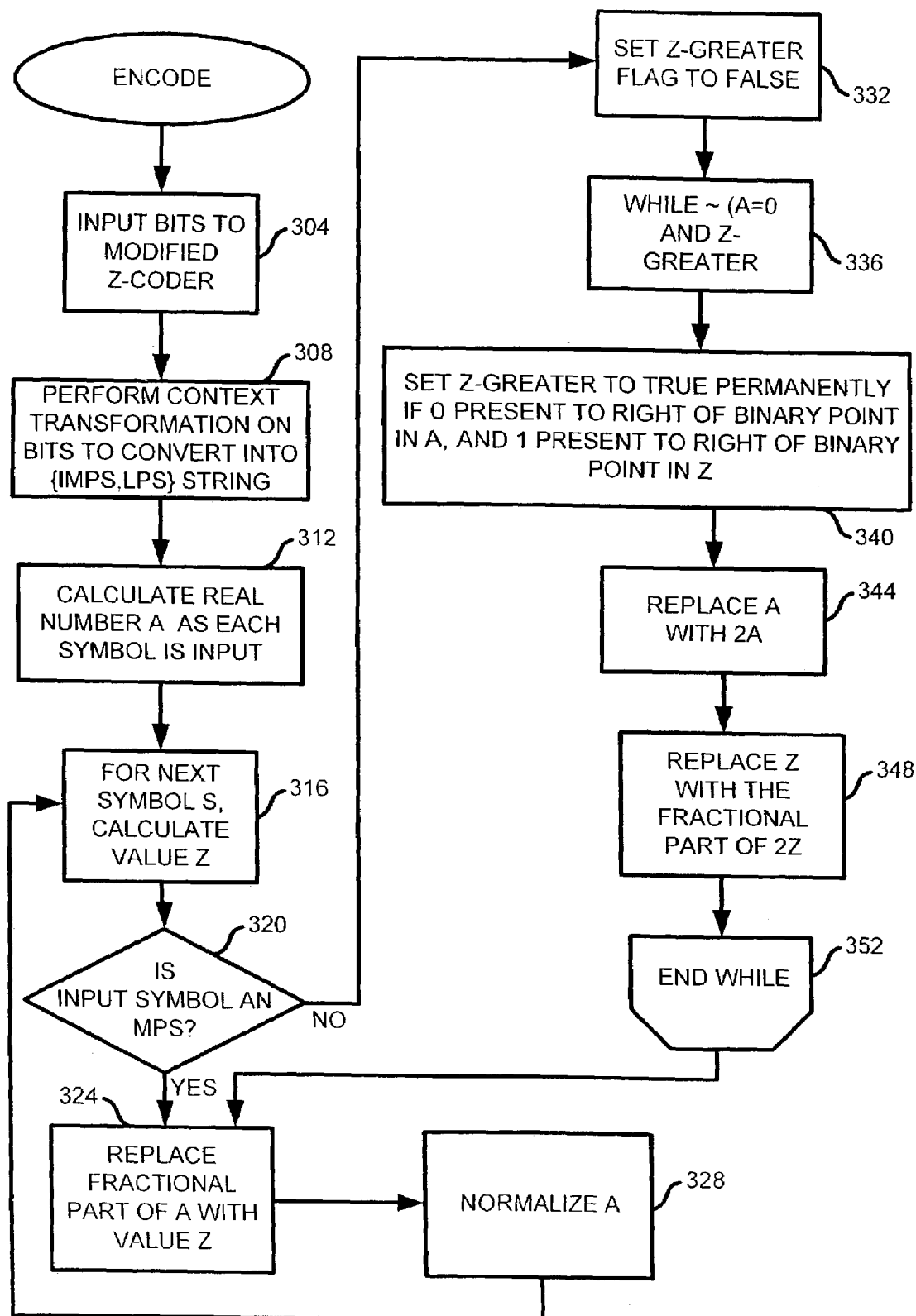
FIG. 5 is a flowchart describing a modified Z-encoder according to one embodiment of the invention.

FIG. 5 is a flowchart describing a modified Z-encoder according to one embodiment of the invention. In step 304 bits are input from any suitable source into the modified Z-encoder. In step 308 context transformation is performed upon the input bit string to convert the bits into an {MPS, LPS} string. Conversion into an MPS (Most Probable Symbol)/LPS (Least Probable Symbol) string is a step known in the art. In step 312 a real binary number A is calculated as each symbol is input. For initialization, A is first set equal to zero. A is a binary number having both integer and fractional parts; calculation of the value A is a standard step in arithmetic coding. A is calculated as each new symbol is input; thus, its value is continually increasing as bits are input to the encoder. Preferably, in this embodiment, the last bit of A is kept equal to 0 so that adjustments of Z as described in *The Z-Coder Adaptive Coder* referenced above generate only integral values.

Step 316 begins a loop that processes each input symbol in turn, i.e., each symbol will be one of an MPS or an LPS. In step 316 the value Z is calculated as is known in the prior art. In this embodiment, 8 bits (in general, m bits) are kept after the binary point for the calculated values, although other implementations may keep fewer or a greater number of bits. Thus, the calculated value for Z will satisfy the condition:

$$\text{fract}(A) + 2^{-m} < Z < 1$$

The following will also hold true:

$$A < \text{int}(A) + Z$$

Step 320 checks whether the next input symbol is an MPS, if so, the control moves to step 324. If not, then the next input symbol is an LPS and control moves to step 332. In step 324 the fractional part of A is replaced with the value Z. In step 328 A is normalized. In this description, normalization of A involves first checking if the fractional part of A is greater than or equal to one-half. If so, then A is replaced by 2A, i.e., A is shifted to the left one binary point. If not, no action is taken. This shifting occurs until the fractional part of A is less than one-half. The result of normalization of A provides that:

$$0 <= \text{fract}(A) < \tfrac{1}{2}$$

Normalization is performed because we know the $2^{-1}$ bit of C. It is also necessary to keep A from growing without bound. Without normalization, A will eventually exceed 1.0. After step 328, processing of the MPS condition is done and control returns to step 316 to process the next input symbol and to calculate a new Z value.

If, on the other hand, step 320 determines that the input symbol is an LPS, then control moves to step 332. At this point, the below steps diverge from the known prior art of the Z-coder. In the known Z-coder, the corresponding steps do not necessarily produce an encoded output that can be relied upon to be decoded back into the original bit stream. Advantageously, we have realized a novel technique to process the LPS condition which does produce an encoded output that can be decoded back into the original bit stream. These steps are presented below.

In step 332 the Z-greater flag is set to false. The Z-greater flag keeps track of whether Z is greater than A. Step 336 begins a while loop that ends at step 352. In step 340 the Z-greater flag is set to true for this loop if there is a 0 to the direct right of the binary point in A, and if there is a 1 to the direct right of the binary point in Z. This operation may be performed by replacing Z-greater with the expression:

Z-greater OR (fract(A)<½ AND~fract(Z)<½)

In step 344 the value A is replaced with 2A, i.e., A is shifted to the left. In step 348 Z is replaced with the fractional part of 2Z. In step 352 the while loop continues as long as the condition in step 336 holds true. When the condition fails, steps 324 and 328 are executed as previously described, and control returns to step 316 to process the next symbol.

As a final termination step, A is shifted by m bits. The final output code word C is equal to A.

Figure 6:
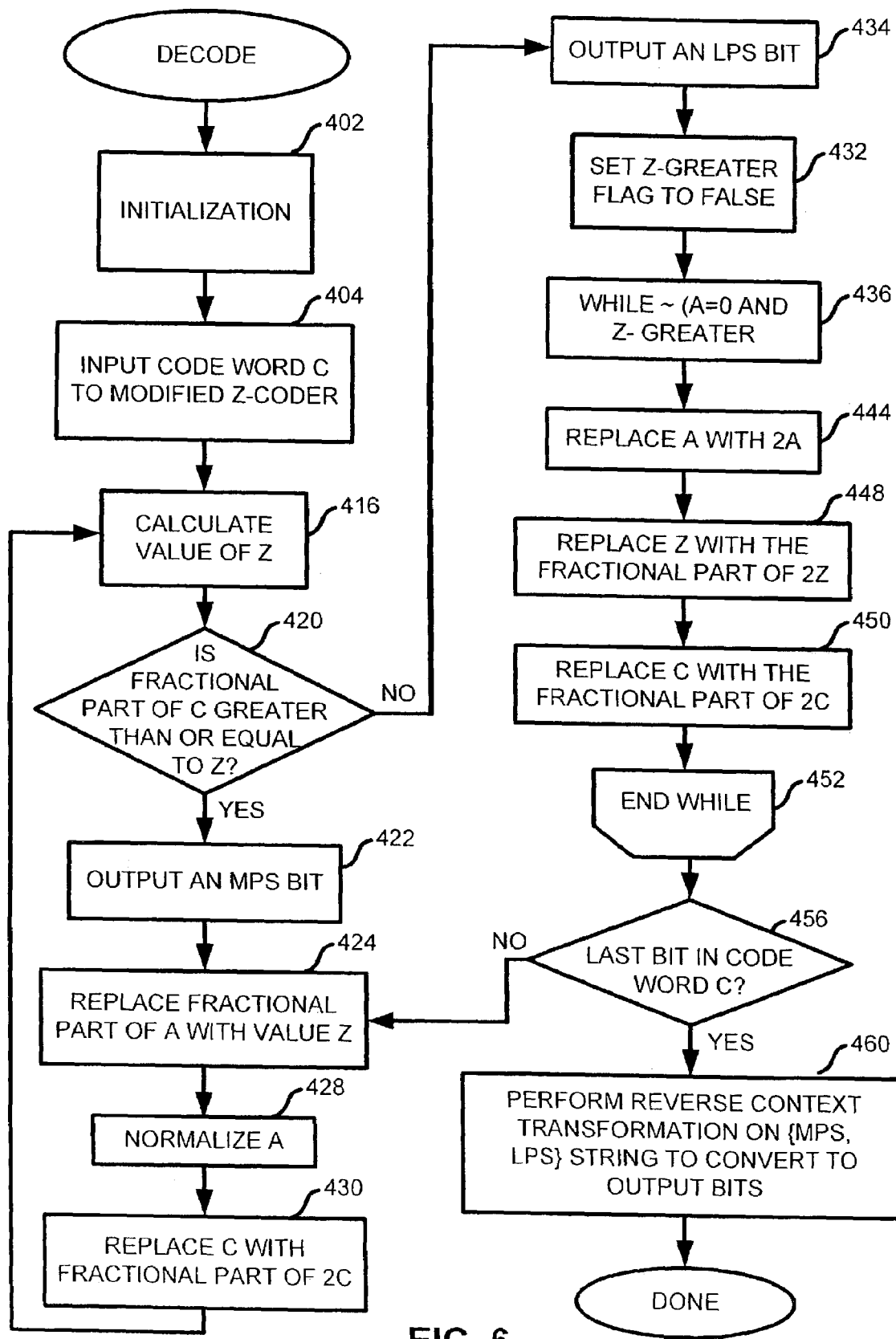
FIG. 6 is a flowchart describing a modified Z-decoder according to one embodiment of the invention.

FIG. 6 is a flowchart describing a modified Z-decoder according to one embodiment of the invention. In step 402 initialization is performed by setting A to 0 and by setting code word C equal to the encoded string to be input such that 0<=C<1. In other words, the binary point is placed in front of the value C so that there is no integer portion.

In step 404 the code word C is input to the modified z-decoder. Step 416 begins a loop in which the value Z is calculated as is known in the prior art. In this embodiment, 8 bits (in general, m bits) are kept after the binary point for the calculated values, although other implementations may keep fewer or a greater number of bits. Thus, the calculated value for Z will satisfy the condition:

$$\text{fract}(A)+2^{-m} < Z < 1$$

The following will also hold true:

$$A < \text{int}(A)+Z$$

Step 420 checks whether the fractional part of C is greater than or equal to Z, if so, control moves to step 422 in which an MPS bit is output from the code word C. If not, then control moves to step 431 in which an LPS bit is output from the code word C. Returning now to step 424, the fractional part of A is replaced with the value Z. In step 428 A is normalized as described above. In step 430 C is replaced with the fractional part of 2C. After step 430, processing of the MPS condition is done and control returns to step 416 to calculate a new Z value.

If, on the other hand, step 420 determines that the fractional part of C is less than Z, then control moves to step 431. At this point, the below steps diverge from the known prior art of the Z-coder. In the known Z-coder, the corresponding steps do not necessarily produce a decoded output that can be relied upon to represent the original bit stream. Advantageously, we have realized a novel technique to process the LPS condition which does produce a decoded output that does return the original bit stream. These steps are presented below.

In step 432 the Z-greater flag is set to false. The Z-greater flag keeps track of whether Z is greater than A. Step 436 begins a while loop that ends at step 452. In step 444 the value A is replaced with 2A, i.e., A is shifted to the left. In step 448 Z is replaced with the fractional part of 2Z. In step 452 the while loop continues as long as the condition in step 436 holds true. When the condition fails, step 456 determines whether the last bit in code word C has been processed. If not, control returns to steps 424–430 and a new Z value is eventually calculated in step 416. If so, then in step 460 the reverse context transformation is performed on the output {MPS, LPS} string to convert into the original bit stream.

NTSC Video Embodiment

In one embodiment, the modified Z-coder is applied to NTSC wavelet video. The input is a D2 digitization of NTSC video where the chroma1 and chroma2 are quadrature modulated on a 3.58 MHz sub-carrier. The modified Z-coder uses a composite 2–6 wavelet pyramid described in *Very Low Cost Video Wavelet Codec*, K. Kolarov, W. Lynch, *SPIE Conference on Applications of Digital Image Processing*, Vol. 3808, Denver, July 1999, plus two levels of Haar pyramid in the time direction (4 field GOP). The dyadic quantization coefficients are powers of 2.

The modified Z-coder was used on several NTSC clips which vary in content and origin. The first clip is a cable broadcast of an interview without much motion. The second clip is a clean, high quality sequence from a laser disk with a panning motion of a fence with vertical bars close together and motion of cars on the background. The next clip is a DSS (satellite) recording of a basketball game (already MPEG2 compressed/decompressed) with lots of motion and detailed crowd and field. The last clip is a high quality sequence from a laser disk with a zooming motion on a bridge with a number of diagonal cables. The size of the frames is 720×486 (standard NTSC) in .tga (targa) format.

The probability values that were used are as follows:

$P_0=0.0107696$; $P_1=0.2924747$; $P_2=0.5$;
$P_3=0.1588221$;

$P_4=0.2924747$; $P_5=0.2924747$; $P_6=0.5$;
$P_7=0.1588221$

Three bits of context are used and the subscripts above denote the different contexts. This choice is made because returns diminish after a few bits of context and 95% prediction can be achieved with 3 bits of context. In the results described below, a very crude scheme is used for non-zero coefficients coding. Only leading zeroes are coded off, the sign and the other bits are coded as themselves. Significance bits in the interval (0, 9) are coded in 9 bits, those in (8, 14) in 23 bits and those in (13,19) in 37 bits. Most non-zeros are coded in 9 bits.

For comparison we have used a high quality commercially available MPEG2 codec from PixelTools. The MPEG2 was generated using the best possible settings for high-quality compression. In this comparison the following are used: 15 frames in a GOP (group of pictures), 3 frames between anchor frames, 29.97 frame rate, 4:2:0 chroma format, medium search range double precision DCT prediction, stuffing enabled, motion estimation sub-sampling by one. The sequences were compressed at 1.0 bpp and 0.5 bpp.

The modified Z-coder (with identity Huffman tables) is also compared with an arithmetic coder described in *Very Low Cost Video Wavelet Codec*. That algorithm uses a separate arithmetic coder for each bit plane. The transform part for both the modified Z-coder and the arithmetic coder is the same 2–6 wavelet pyramid. This arithmetic coder is on par with MPEG2 in a number of sequences in terms of PSNR (signal-to-noise ratio—mean-square error).

The only sequence that MPEG2 achieves statistically better PSNR is the basketball sequence in which MPEG can take advantage of the significant amount of (expensive) motion estimation characteristic for that method. Also, this sequence is a recording from DSS, i.e. it was already MPEG compressed and decompressed before being tested with the coders.

Also, perceptually the quality of MPEG2 vs. arithmetic vs. modified Z-coder is very similar. For the fence sequence in particular the quality of MPEG2 compressed video deteriorates significantly for lower bit rates, even though the PSNR is comparable to the modified Z-coder. Even though the basketball sequence presents an advantage for MPEG in terms of PSNR, visually the three methods are very comparable.

Alternative Embodiments

The steps presented above for a modified Z-coder may also be optimized in any suitable fashion. For example, the known "fast path" or "fence" techniques may be used. Also, the calculation of Z may be varied in an adaptive way to produce a binary context coder. Further, other known pieces of the Z-coder not used above may be added back into the algorithm. The above technique may be used to encode and decode any suitable bit stream and not necessarily a bit stream from video image data. For example, the present invention may be used to code a bit stream representing text from a book or other similar applications.

Computer System Embodiment

Figure 7:
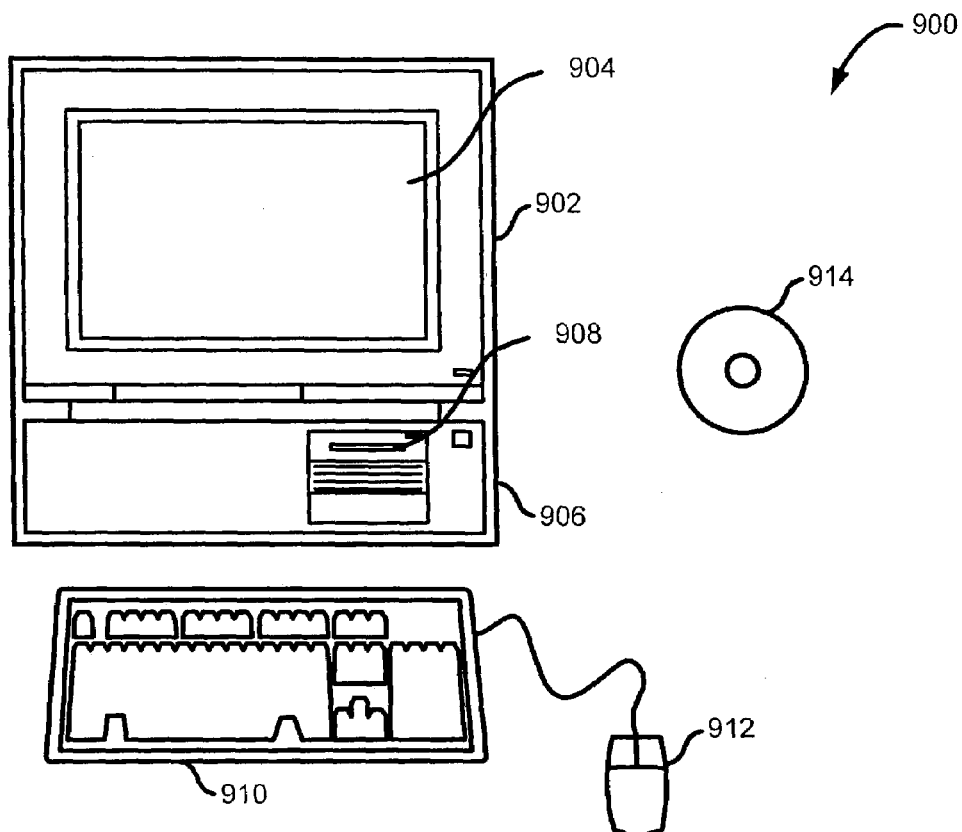
FIGS. 7 and 8 illustrate a computer system suitable for implementing embodiments of the present invention.
Figure 8:
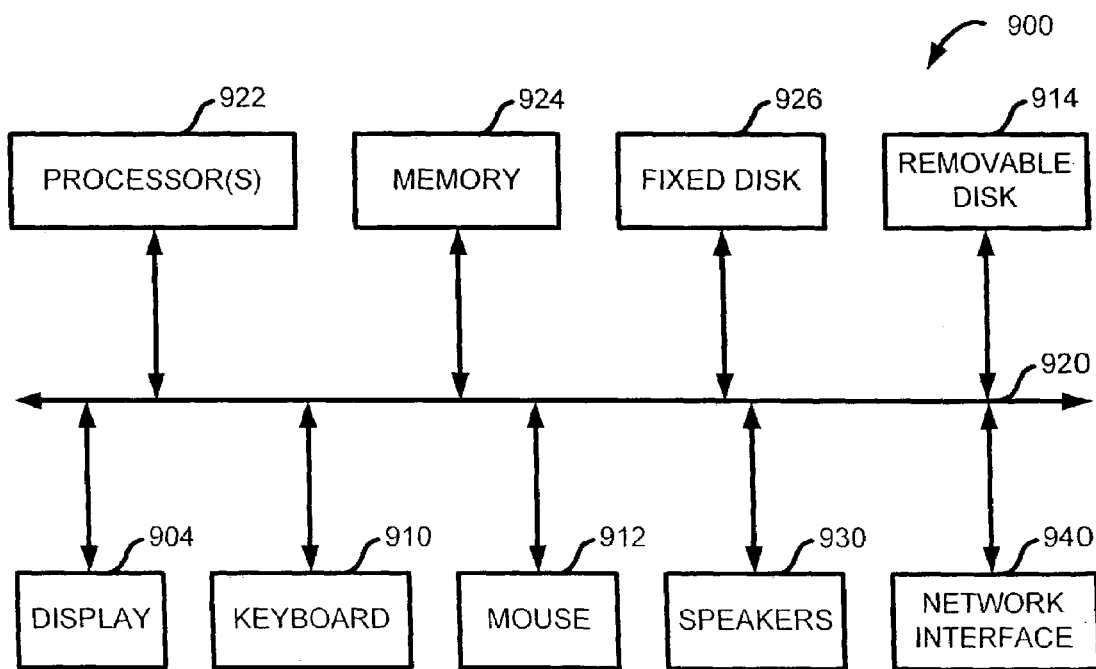

FIGS. 7 and 8 illustrate a computer system 900 suitable for implementing embodiments of the present invention. FIG. 7 shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 8 is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes may be practiced within the scope of the appended claims. Therefore, the described embodiments should be taken as illustrative and not restrictive, and the invention should not be limited to the details given herein but should be defined by the following claims and their full scope of equivalents.

We claim:

1. A method for encoding a stream of bits using a modified Z-coder, comprising:

inputting said stream of bits to said modified Z-coder, said modified Z-coder operative to manipulate variables A and Z, and an MPS/LPS string; wherein said modified Z-coder performs an operation when a symbol in the MPS/LPS string is an LPS; wherein the operation is comprised of:

repeating a series of steps while the value of A is not zero; wherein the series is comprised of:

performing a binary point shift on A; and performing a binary point shift on Z; and wherein the series is repeated while the value of A is at least the value of Z, and the expression (fract(A)<½ AND~fract(Z)<½) is false.

2. A method for encoding a stream of bits using a modified Z-coder, comprising:

inputting said stream of bits to said modified Z-coder, said modified Z-coder operative to manipulate variables A and Z, and an MPS/LPS string: wherein said modified Z-coder performs an operation when a symbol in the MPS/LPS string is an LPS; wherein the operation is comprised of:

repeating a series of steps while the value of A is not zero; wherein the series is comprised of:

performing a binary point shift on A; and performing a binary point shift on Z; and wherein the binary point shift on A is accomplished using the operation A=2A; and wherein the binary point shift on Z is accomplished using the operation Z=fract(2Z).

3. A method for encoding a stream of bits as in claim 2, wherein the series of steps is repeated while the value of A is at least the value of Z.

4. A method for encoding a stream of bits as in claim 2, wherein the series of steps is repeated while the value of A is at least the value of Z, and the value of A to the direct right of the binary point in A is at least the value of Z to the direct right of the binary point in Z.

5. A method for decoding a stream of encoded bits using a modified Z-coder, comprising:

inputting said stream of encoded bits to said modified Z-coder, said modified Z-coder operative to manipulate variables A and Z, and a code word C; wherein said modified Z-coder performs an operation when the fractional part of the value of C is less than the value of Z; wherein the operation is comprised of:

repeating a series of steps while the value of A is not zero; wherein the series is comprised of:

performing a binary point shift on A;
    performing a binary point shift on Z; and
    performing a binary point shift on C; and wherein the binary point shift on A is accomplished using the operation A=2A; wherein the binary point shift on Z is accomplished using the operation Z=fract(2Z); and wherein the binary point shift on C is accomplished using the operation C=fract(2C).

6. A method for decoding a stream of encoded bits as in claim 5, wherein the series of steps is repeated while the value of A is at least the value of Z.

* * * * *